(12) United States Patent
Solowan

(10) Patent No.: US 10,656,537 B2
(45) Date of Patent: May 19, 2020

(54) METHOD FOR DETECTING THE POSITION OF A MASK HOLDER ON A MEASURING TABLE

(71) Applicant: Carl Zeiss SMT GmbH, Oberkochen (DE)

(72) Inventor: Hans-Michael Solowan, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/166,345

(22) Filed: Oct. 22, 2018

(65) Prior Publication Data

US 2019/0056674 A1 Feb. 21, 2019

Related U.S. Application Data

(63) Continuation of application No. PCT/EP2017/059370, filed on Apr. 20, 2017.

(30) Foreign Application Priority Data

Apr. 22, 2016 (DE) ........................ 10 2016 107 524

(51) Int. Cl.
*G03F 7/20* (2006.01)
*G06T 7/00* (2017.01)
(Continued)

(52) U.S. Cl.
CPC ........ *G03F 7/70775* (2013.01); *G01B 11/002* (2013.01); *G01B 11/005* (2013.01);
(Continued)

(58) Field of Classification Search
CPC .... G03F 7/70775; G03F 7/20; G03F 7/70716; G01B 21/045; G01B 5/008
(Continued)

(56) References Cited

U.S. PATENT DOCUMENTS

| | | | |
|---|---|---|---|
| 5,798,947 A * | 8/1998 | Ye | ........................... B82Y 10/00 |
| | | | 702/153 |
| 6,008,610 A | 12/1999 | Yuan et al. | |

(Continued)

FOREIGN PATENT DOCUMENTS

| | | | | |
|---|---|---|---|---|
| DE | 102006059440 | | 6/2008 | ............. G01B 11/03 |
| DE | 102009044294 | | 5/2011 | ............. G01B 11/03 |

(Continued)

OTHER PUBLICATIONS

International Search Report and Written Opinion of International Application No. PCT/EP2017/059370 dated Jul. 25, 2017.
(Continued)

*Primary Examiner* — Hung Nguyen
(74) *Attorney, Agent, or Firm* — Fish & Richardson P.C.

(57) ABSTRACT

The invention relates to a method for detecting the position of a mask holder for photolithographic masks, said method including the following steps:
    positioning the mask holder with the mask on a measuring table of a measurement apparatus,
    measuring the mask holder by use of an algorithm,
    storing the absolute position of the mask holder on the measuring table, and
    recording and storing at least one reference image.

19 Claims, 1 Drawing Sheet

Figure 1:
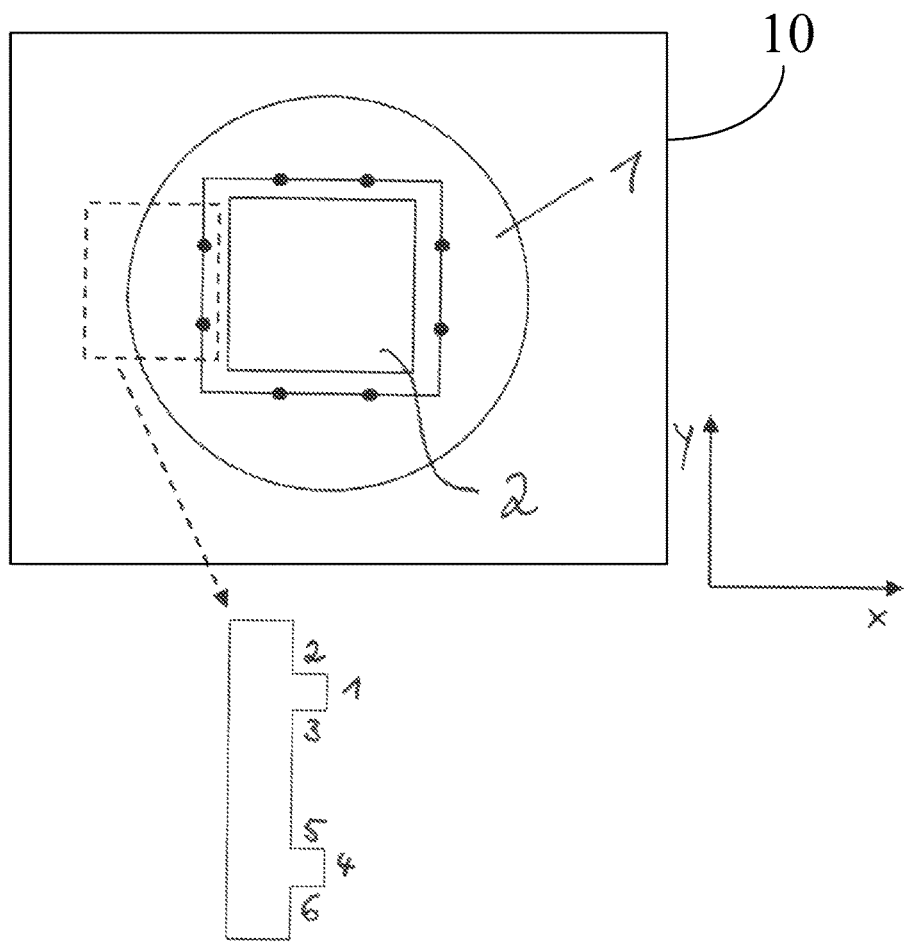

(51) Int. Cl.
*G06T 7/12* (2017.01)
*G06T 7/73* (2017.01)
*G03F 1/84* (2012.01)
*G03F 9/00* (2006.01)
*G01B 11/00* (2006.01)
*G01N 21/956* (2006.01)

(52) U.S. Cl.
CPC ............ *G03F 1/84* (2013.01); *G03F 7/70691* (2013.01); *G03F 9/7011* (2013.01); *G06T 7/001* (2013.01); *G06T 7/12* (2017.01); *G06T 7/74* (2017.01); *G01N 2021/95676* (2013.01); *G06T 2207/10056* (2013.01); *G06T 2207/30148* (2013.01)

(58) Field of Classification Search
USPC ..................................................... 355/72–76
See application file for complete search history.

(56) References Cited

U.S. PATENT DOCUMENTS

| | | | | |
|---|---|---|---|---|
| 2005/0086820 | A1* | 4/2005 | Stiblert | G01B 21/045 33/502 |
| 2009/0024351 | A1* | 1/2009 | Fricke | G01B 21/045 702/150 |
| 2010/0205815 | A1* | 8/2010 | Rinn | G01B 5/008 33/502 |
| 2011/0090483 | A1 | 4/2011 | Heiden | |
| 2011/0225554 | A1 | 9/2011 | Laske et al. | |
| 2011/0255770 | A1 | 10/2011 | Touya et al. | |

FOREIGN PATENT DOCUMENTS

| | | | | |
|---|---|---|---|---|
| JP | S 64-9303 | 1/1989 | ............ | G01B 11/00 |
| JP | 11-317367 | 11/1999 | ........... | H01L 21/027 |
| JP | 2011-221264 | 11/2011 | ............... | G03F 1/08 |
| KR | 94-4989 | 3/1994 | ............... | H04B 5/00 |

OTHER PUBLICATIONS

Notice of Reasons for Rejection for Japanese Application No. JP 2018-555472 dated Oct. 18, 2019 (with English Translation).
Schlueter et al., "First Performance Data Obtained on Next Generation Mask Metrology Tool", 21st Annual BACUS Symposium on Photomask Technology, Proceedings of SPIE, vol. 4562, pp. 237-246 (Mar. 11, 2002).
Notice of Reasons for Rejection for Korean Application No. KR 10-2018-7032749 dated Oct. 29, 2019 (with English Translation).

* cited by examiner

METHOD FOR DETECTING THE POSITION OF A MASK HOLDER ON A MEASURING TABLE

CROSS-REFERENCE TO RELATED APPLICATIONS

This application is a continuation of and claims priority under 35 U.S.C. § 120 from PCT Application No. PCT/EP2017/059370, filed on Apr. 20, 2017, which claims priority from German Application No. DE 10 2016 107 524.8, filed on Apr. 22, 2016. The entire contents of each of these priority applications are incorporated herein by reference.

DESCRIPTION

The invention relates to a method for detecting the position of a mask holder for masks for semiconductor lithography, in particular a method for calibrating a measurement system used to this end. Such masks usually contain a structure, a so-called pattern, which is imaged on a semiconductor substrate, a so-called wafer, within the scope of the production of semiconductor components.

Within the scope of the production and the subsequent application of the aforementioned masks, it is necessary to determine the absolute position of the pattern on the mask. To this end, use is usually made of a coordinate measuring machine specifically developed for this application. The commercially available PROVE® system by Carl Zeiss SMT GmbH is specified here in exemplary fashion. The aforementioned system measures the absolute position of the pattern on the mask, inter alia, for example using marks, the so-called alignment marks, which have been attached to the mask for this purpose. Other structures present on the mask can also be used for this purpose. On the basis of the positioning error of the pattern on the mask established thus, it is subsequently possible either to actively intervene in the mask production or else to use the established positioning error, where appropriate, as information when exposing a semiconductor wafer in a projection exposure apparatus.

Additionally, for the purposes of producing a mask, it is important to determine the so-called centrality in addition to a multiplicity of other parameters. The centrality is understood to be the relative offset of the centroid of the pattern in relation to the center of gravity of the glass body of the mask. This offset is practically independent of the relative position of the pattern in relation to the alignment marks; knowledge about the positions of the glass edges of the mask body is necessary for the determination thereof. To this end, the relative position of the glass edges of the mask body in relation to edges of the mask holder is usually determined first. If the positions of the edges of the mask holder are now known in the coordinate system of the measurement system, it is possible to determine the positions of the edges of the mask body by way of a suitable transformation and hence ultimately determine the centrality, inter alia. Thus, it is essential, for the reproducibility and ultimately also for the accuracy of the determination of the centrality, to obtain accurate knowledge, in particular about the positions of the edges of the mask holder in the coordinate system of the measuring machine.

Here, the mask holder is designed in such a way that it holds the mask in an approximately square cutout. Here, the inner edges of the mask holder correspond to the sides of the square formed thus; on each side, they have two substantially rectangular projections, the so-called protrusions, by use of which the edge position of the mask holder is determined. To this end, two measurement points on the protrusions are determined per side in order to be able to determine the edge profile of the holder. In the method known from the prior art, straight lines were approximated to the edge profile in the process. However, this procedure is afflicted by errors on account of the significant roughness or irregularity of the holder edges, particularly in the y-direction, due to the manufacturing method. If different image portions are used for measuring the holder edges during a measurement operation on account of the placement tolerances of the mask holder on the measuring table of the measurement system, significant measurement errors could arise herefrom.

The previous conventional processes in the measurement system are presented once again as an overview below for clarification purposes:

1. Calibrating the mask holder position on the measuring table (holder calibration):
   a. loading the mask holder with the mask;
   b. recording measurement images and measuring the holder edges by use of edge finding; and
   c. saving the measured absolute position of the holder on the measuring table as a reference position.
2. Loading the mask holder with the mask during daily measurement operation:
   a. loading the mask holder with the mask;
   b. driving to the reference positions saved during the calibration;
   c. recording measurement images; and
   d. measuring the mask holder edges in absolute terms by use of edge finding with the holder position on the measuring table as a result.

It is an object of the present invention to specify a method that improves, in particular, the repeatability of the measurement of the mask holder.

This object is achieved by a method having the features of independent claim 1. The dependent claims concern advantageous developments and variants of the invention.

The method according to the invention comprises the following steps:
   positioning the mask holder with the mask on a measuring table of a measurement apparatus,
   measuring the mask holder by use of an algorithm,
   storing the absolute position of the mask holder on the measuring table.

According to the invention, at least one reference image is additionally recorded and stored.

Measuring the mask holder can be implemented on the basis of a characteristic region of the mask, i.e., a pattern that is easily identifiable by use of image processing. In an advantageous variant of the invention, measuring can be carried out by virtue of holder edges being measured by use of an edge finding algorithm for the purposes of measuring the mask holder.

In particular, the reference image can comprise a portion of a holder edge; however, in principle, other characteristic regions of the holder can also be used for producing the reference image.

Recording the measurement image—in which, for example, the exact edge profile is recorded for, in particular, irregularly formed edges, too—then allows an increased reproducibility of the measurement to be achieved in the subsequent measurement method, as described below:

In the method:
   the mask holder is initially loaded again,
   the mask holder is positioned at the stored absolute position, at least one measurement image is recorded, and the relative position of the new position of the mask holder is determined by comparing at least one portion of a measurement image with at least one portion of the reference image.

Here, in particular, the mentioned comparison can be undertaken by use of a two-dimensional correlative image analysis.

As a result of the described comparison between measurement image and reference image, it is possible to determine the relative offset between reference image and measurement image so that the reproducibility of the individual measurements of the holder position significantly increases over a plurality of measurement cycles (i.e., over a plurality of placement processes of the holder with the mask). A reliable two-dimensional image correlation is facilitated by the structure of the holder edges. This arises during the production of the mask holder and does not change; i.e., it represents a type of fingerprint of the mask holder, on the basis of which it is possible to unambiguously determine a displacement of the holder in the measurement image relative to the reference image. On account of the irregular structure of the holder edge due to production processes, the comparison between measurement image and reference image can be implemented on the basis of a single measurement image per measurement point. In this case, the irregularity of the holder edge, particularly in the x-direction, which superficially tends to be unwanted, tends to be advantageous. In the case of a perfectly straight edge, it would be impossible to detect an offset of the measurement image in relation to the reference image along the edge direction. However, it is advantageous to record at least two measurement images in order also to be able to reliably determine rotations of the holder.

Following the above-described calibration and by virtue of applying an autocalibration method with a photomask, the absolute accuracy now likewise can be significantly increased as a result of the significantly increased reproducibility.

Here, geometric parameters of the mask can be measured in different rotational positions for the purposes of determining a systematic error of the position of the mask holder on the measuring table.

In particular, the mask can be measured in four rotational positions, respectively offset by 90°; here, the centrality of position marks on the mask can be determined for each rotational position.

As a result of the position of the mask holder being able to be set in a reproducible manner, i.e., with an error that, although it is unknown, is constant, on account of the now known offset of the current position of the mask holder in relation to the (error-afflicted) initial reference position, it is ultimately possible to establish the error itself substantially more accurately than was previously possible using the method known from the prior art. To this end, the offset of the origin of the mask coordinate system in relation to the origin of the mask holder coordinate system is determined by way of the mentioned rotation of the mask. In those cases in which this offset is not equal to zero, a different value will arise for each different angle position of the rotation in the (co-rotating) mask holder coordinate system, and so four points lying on a circular arc are obtained in the coordinate system of the mask holder in the case of four rotational positions. Then, the absolute error when determining the position of the mask holder on the measuring table, i.e., in the machine coordinate system, can be deduced from the radius of the circle.

Consequently, the absolute accuracy of the measurement system can be significantly increased.

Figure 2:
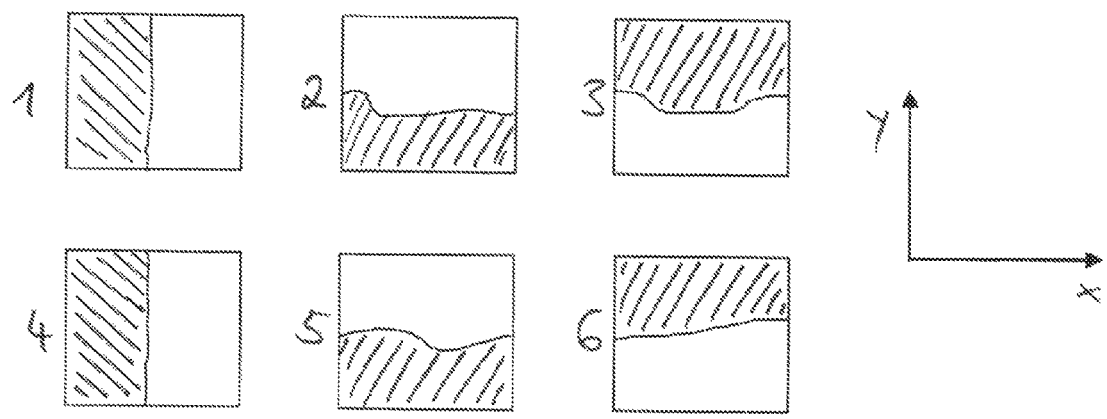

Exemplary embodiments and variants of the invention are explained in greater detail below with reference to the drawings. In the figures:

FIG. 1 shows a schematic illustration of a mask holder with a mask arranged therein and FIG. 2 shows exemplary profiles of the mask edges in selected regions.

In an exemplary illustration, FIG. 1 shows a mask holder 1 with a mask 2 arranged therein on three point bearings that are not illustrated in the figure. Typically, the mask holder 1 is used to receive masks 2 to be measured and to bear the latter on the measuring table 10 of the measurement system for the duration of the measurement; it is regularly used to receive different masks in succession. As already mentioned, accurate knowledge about the position of the mask holder 1 on the measuring table 10 is essential for precise and reproducible measurement of structures on the mask 2. However, a systematic error is included in the establishment of the position of the mask holder 1 on the measuring table 10, said systematic error being due to the structure of the mask holder 1 itself. For the purposes of measuring the mask holder 1 on the measuring table 10, the measurement points, which are illustrated in the figure but not labeled separately, on the inner side of the mask holder 1 facing the mask 2 are used.

From the sectional magnification in the figure, it is clear that the measurement points are situated in the region of so-called protrusions 3, i.e., substantially rectangular projections. Since these protrusions 3 have both have an edge in the x-direction and have two edges in the y-direction, measuring of the mask holder 1 by use of a light microscope can be undertaken in both directions on the basis of a protrusion 3, without the mask holder 1 having to be displaced over long paths to this end. Here, variants in which the protrusions 3 can be dispensed with are also conceivable. For identification purposes, the edges are numbered in increasing fashion in FIG. 2 described below.

FIG. 2 shows, in an exemplary fashion, an edge profile in the regions denoted accordingly in the sectional magnification in FIG. 1, said edge profile having been established by use of a light microscope. The individual, irregular edge profiles, particularly in the y-direction, are clearly identifiable. When the mask holder 1 is now placed onto the measuring table, a certain offset, for example along the x-direction, may occur in relation to a first reference position of the mask holder 1 on the measurement table on account of the finite positioning accuracy of the handling robot used to this end. However, this offset leads to determining the y-edge (i.e., the edge used to determine the y-position of the mask holder 1 and extending in the x-direction) by fitting a straight line to the edge on the basis of a portion of the edge deviating from the reference position. The inhomogeneity of the y-edge, clearly visible in FIG. 2, then has an incorrect determination of the y-position as a consequence. However, if the profile of the edge in the region used for the measurement is also saved for the reference position, it is possible to determine the offset of the portion, and hence of the mask holder 1, in relation to the reference measurement in the x- and y-direction and also possible to determine possible tilts in particular for edges extending in an irregular fashion, such as precisely for the y-edges, on the basis of a comparison of the currently recorded image of the edge portion and the image recorded on the basis of the reference measurement. Hence, the determination of the position of the mask holder on the measuring table overall becomes more reproducible which, as illustrated above, also opens up the possibility of determining the systematic error when establishing the position of the mask holder 1.

What is claimed is:

1. A method for detecting the position of a mask holder for photolithographic masks, said method comprising:
    positioning the mask holder with the mask on a measuring table of a measurement apparatus,
    measuring the mask holder by use of an algorithm, including using an edge finding algorithm to measure mask holder edges, and
    storing the absolute position of the mask holder on the measuring table,
    wherein at least one reference image is recorded and stored, and the reference image comprises a portion of a holder edge.

2. The method as claimed in claim 1, wherein
    the mask holder is loaded again,
    the mask holder is positioned at the stored absolute position,
    at least one measurement image is recorded, and
    the relative position of the new position of the mask holder is determined by comparing at least one portion of a measurement image with at least one portion of the reference image.

3. The method as claimed in claim 2, wherein the comparison is implemented by use of a two-dimensional correlative image analysis.

4. The method as claimed in claim 1, wherein geometric parameters of the mask are measured in different rotational positions for the purposes of determining a systematic error of the position of the mask holder on the measuring table.

5. The method as claimed in claim 4, wherein the mask is measured in four rotational positions, respectively offset by 90°, and the centrality of position marks on the mask is determined for each rotational position.

6. The method as claimed in claim 2, wherein geometric parameters of the mask are measured in different rotational positions for the purposes of determining a systematic error of the position of the mask holder on the measuring table.

7. The method as claimed in claim 3, wherein geometric parameters of the mask are measured in different rotational positions for the purposes of determining a systematic error of the position of the mask holder on the measuring table.

8. A method for detecting the position of a mask holder for photolithographic masks, the method comprising:
    positioning the mask holder with the mask on a measuring table of a measurement apparatus;
    storing an absolute position of the mask holder on the measuring table;
    recording and storing at least one reference image that includes a portion of an inner edge of the mask holder;
    loading the mask holder again,
    positioning the mask holder at the stored absolute position,
    recording at least one measurement image, in which the measurement image comprises a portion of an inner edge of the mask holder, and
    determining the relative position of the new position of the mask holder by comparing at least a portion of the measurement image having the portion of the inner edge of the mask holder with at least a portion of the reference image having the portion of the inner edge of the mask holder.

9. The method of claim 8 in which comparing at least a portion of the measurement image having the portion of the inner edge of the mask holder with at least a portion of the reference image having the portion of the inner edge of the mask holder comprises using a two-dimensional correlative image analysis.

10. The method of claim 8, comprising measuring geometric parameters of the mask in different rotational positions for the purposes of determining a systematic error of the position of the mask holder on the measuring table.

11. The method of claim 10, comprising:
    measuring the mask in four rotational positions, respectively offset by 90°, and
    determining the centrality of position marks on the mask for each rotational position.

12. A method for detecting the position of a mask holder for photolithographic masks, the method comprising:
    positioning the mask holder with the mask on a measuring table of a measurement apparatus;
    storing an absolute position of the mask holder on the measuring table;
    recording and storing at least one reference image that includes a portion of an edge of the mask holder, in which the edge has an irregular structure that represents a fingerprint of the mask holder;
    loading the mask holder again,
    positioning the mask holder at the stored absolute position,
    recording at least one measurement image, in which the measurement image comprises a portion of an edge of the mask holder, in which the edge has an irregular structure, and
    determining the relative position of the new position of the mask holder by comparing at least a portion of the measurement image with at least a portion of the reference image, including comparing the irregular structure of the holder edge in the measurement image with the irregular structure of the holder edge in the reference image.

13. The method of claim 12 in which comparing at least a portion of the measurement image with at least a portion of the reference image comprises using a two-dimensional correlative image analysis.

14. The method of claim 12, comprising measuring geometric parameters of the mask in different rotational positions for the purposes of determining a systematic error of the position of the mask holder on the measuring table.

15. The method of claim 12, comprising:
    measuring the mask in four rotational positions, respectively offset by 90°, and
    determining the centrality of position marks on the mask for each rotational position.

16. The method of claim 8 in which comparing at least a portion of the measurement image with at least a portion of the reference image, including comparing the irregular structure of the holder edge in the measurement image with the irregular structure of the holder edge in the reference image.

17. The method of claim 1 in which the reference image comprises a portion of an edge of a protrusion of the mask holder.

18. The method of claim 8 in which the reference image comprises a portion of an edge of a protrusion of the mask holder.

19. The method of claim 12 in which the reference image comprises a portion of an edge of a protrusion of the mask holder.

* * * * *